US007881025B2

(12) United States Patent
Shimazawa et al.

(10) Patent No.: US 7,881,025 B2
(45) Date of Patent: Feb. 1, 2011

(54) MAGNETO-RESISTIVE EFFECT DEVICE HAVING A SPACER LAYER OF A SEMICONDUCTOR LAYER INTERPOSED BETWEEN FIRST AND SECOND NONMAGNETIC METAL LAYERS AND A WORK FUNCTION CONTROL LAYER FOR USE IN A THIN-FILM MAGNETIC HEAD USABLE IN A HEAD GIMBAL ASSEMBLY IN A HARD DISK SYSTEM

(75) Inventors: Koji Shimazawa, Tokyo (JP); Yoshihiro Tsuchiya, Tokyo (JP); Tomohito Mizuno, Tokyo (JP); Kei Hirata, Tokyo (JP)

(73) Assignee: TDK Corporation, Tokyo (JP)

( * ) Notice: Subject to any disclaimer, the term of this patent is extended or adjusted under 35 U.S.C. 154(b) by 737 days.

(21) Appl. No.: 11/931,219

(22) Filed: Oct. 31, 2007

(65) Prior Publication Data

US 2008/0106827 A1    May 8, 2008

(30) Foreign Application Priority Data

Nov. 6, 2006    (JP)    ............................. 2006-300008

(51) Int. Cl.
*G11B 5/39* (2006.01)
(52) U.S. Cl. .................................. 360/324.2
(58) Field of Classification Search ...... 360/324–324.2; 365/145, 158, 171–173; 257/421–427; 428/810–816; 29/603.7–603.18
See application file for complete search history.

(56) References Cited

U.S. PATENT DOCUMENTS 6,777,731 B2 * 8/2004 Kreupl ....................... 257/295
6,861,718 B2 * 3/2005 Sato et al. ................... 257/423
2006/0067017 A1    3/2006 Yuasa et al.
2008/0019060 A1    1/2008 Mizuno

FOREIGN PATENT DOCUMENTS

JP    2003-8102    1/2003

OTHER PUBLICATIONS

U.S. Appl. No. 11/626,562, filed Jan. 24, 2007, Hara, et al.

(Continued)

*Primary Examiner*—A. J. Heinz
(74) *Attorney, Agent, or Firm*—Oblon, Spivak, McClelland, Maier & Neustadt, L.L.P.

(57) ABSTRACT

The invention provides a CPP-GMR device comprising a spacer layer. The spacer layer comprises a first nonmagnetic metal layer and a second nonmagnetic metal layer, each formed of a nonmagnetic metal material, and a semiconductor layer interposed between the first nonmagnetic metal layer and the second nonmagnetic metal layer, and further comprises a work function control layer formed between the first nonmagnetic metal layer and the semiconductor layer and/or between the second nonmagnetic metal layer and the semiconductor layer. The semiconductor layer is an n-type semiconductor, and the work function control layer is made of a material having a work function smaller than that of said first nonmagnetic metal layer, and said second nonmagnetic metal layer. It is thus possible to obtain by far more improved advantages.

12 Claims, 5 Drawing Sheets

OTHER PUBLICATIONS

U.S. Appl. No. 11/757,174, filed Jun. 1, 2007, Tsuchiya, et al.
U.S. Appl. No. 11/865,384, filed Oct. 1, 2007, Hara, et al.
U.S. Appl. No. 11/870,097, filed Oct. 10, 2007, Shimazawa, et al.
U.S. Appl. No. 11/934,979, filed Nov. 5, 2007, Mizuno, et al.
U.S. Appl. No. 11/968,911, filed Jan. 3, 2008, Tsuchiya, et al.
U.S. Appl. No. 12/128,352, filed May 28, 2008, Mizuno, et al.

* cited by examiner

MAGNETO-RESISTIVE EFFECT DEVICE HAVING A SPACER LAYER OF A SEMICONDUCTOR LAYER INTERPOSED BETWEEN FIRST AND SECOND NONMAGNETIC METAL LAYERS AND A WORK FUNCTION CONTROL LAYER FOR USE IN A THIN-FILM MAGNETIC HEAD USABLE IN A HEAD GIMBAL ASSEMBLY IN A HARD DISK SYSTEM

BACKGROUND OF THE INVENTION

1. Field of the Invention

The present invention relates to a magneto-resistive effect device for reading the magnetic field strength of a magnetic recording medium or the like as signals, a thin-film magnetic head comprising that magneto-resistive effective device, and a head gimbal assembly and a hard disk system comprising that thin-film magnetic head.

2. Explanation of the Prior Art

With recent improvements in the plane recording density of hard disk systems, there has been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often referred to as the MR (magneto-resistive) device for short) and a recording head having a write-only induction type magnetic device are stacked on a substrate.

For the MR device, there is the mention of an AMR device harnessing an anisotropic magneto-resistive effect, a GMR device harnessing a giant magneto-resistive effect, a TMR device harnessing a tunnel-type magneto-resistive effect, and so on.

The reproducing head is required to have high sensitivity and high outputs in particular. GMR heads using a spin valve type GMR device have already been mass-produced as a reproduction head possessing such performances, and to meet further improvements in plane recording densities, reproducing heads using TMR devices are now being mass-produced, too.

In general, the spin valve type GMR device comprises a nonmagnetic layer, a free layer formed on one surface of that nonmagnetic layer, a fixed magnetization layer formed on another surface of the nonmagnetic layer, and a pinned layer (generally an antiferromagnetic layer) on the side of the fixed magnetization layer facing away from the non-magnetic layer. The free layer has its magnetization direction changing depending on an external signal magnetic field, and the fixed magnetization layer has its magnetization direction fixed by a magnetic field from the pinned layer (antiferromagnetic layer).

Incidentally, common GMR heads used so far in the art have a CIP (current in plane) structure wherein a current for detecting magnetic signals (the so-called sense current) is passed parallel with the plane of each of the layers forming the GMR device (CIP-GMR device). On the other hand, GMR devices having the so-called CPP (current perpendicular to plane) structure wherein the sense current is passed perpendicularly to the plane of each of the layers forming the GMR device (CPP-GMR device), too, are now under development as next-generation ones.

The aforesaid TMR devices, too, would come under the CPP structure category according to a classification system from the current-passing direction alone. However, the multilayer construction and detection principle of the TMR device are different from those of the CPP-GMR device. That is, the TMR device generally comprises a free layer, a fixed magnetization layer, a tunnel barrier layer located between them, and an antiferromagnetic layer located on the plane of the fixed magnetization layer that faces away from its plane in contact with the tunnel barrier layer. The tunnel barrier layer is a nonmagnetic insulating layer through which electrons can pass in a state with spins reserved by the tunnel effect. The rest of the multilayer structure, i.e., the free layer, fixed magnetization layer and antiferromagnetic layer could be basically identical with those used with the spin valve type GMR device.

And now, when the TMR device is used for a reproducing head, it is required to have low resistance for the following reasons. For a magnetic disk system, there is a demand for improved recording density and improved data transfer rate, with which the reproducing head is required to have good high-frequency response. However, as the resistance value of the TMR device grows large, it will cause an increase in stray capacitances occurring at the TMR device and a circuit connected to it, rendering the high-frequency response of the reproducing head worse. This is the reason the TMR device must inevitably have low resistance.

Generally speaking, reducing the thickness of the tunnel barrier layer would work for making the resistance of the TMR device low. However, too thin a tunnel barrier layer would cause a lot more pinholes to occur in the tunnel barrier layer, rendering the service life of the TMR device short. Further, there would be a magnetic couple produced between the free layer and the fixed magnetization layer, ending up with problems: a lot more noise, a drop of the MR ratio, and degradation of TMR device's performance. The noise occurring at the reproducing head is here called head noise. The head noise occurring at the reproducing head using the TMR device includes shot noise, a noise component that is unlikely to occur at a reproducing head using the GMR device. Thus, a problem with the reproducing head using the TMR device is that the head noise is noticeable.

With the CPP-GMR device, on the other hand, there is a problem that no large enough MR ratio is obtained. A possible reason for it could be that spin-polarized electrons are scattered at the interface between the nonmagnetic electroconductive layer and the magnetic layer and in the nonmagnetic electroconductive layer.

Also, the CPP-GMR device, because of having a small resistance value, is low in terms of the amount of resistance change. For this reason, in order to obtain large reproduction output with the CPP-GMR device, high voltage must be applied to that device. However, the application of high voltage to the device offers such problems as described below. With the CPP-GMR device, currents are passed in a direction perpendicular to the plane of each layer, whereupon spin-polarized electrons are poured from the free layer into the fixed magnetization layer or from the fixed magnetization layer into the free layer. Such spin-polarized electrons cause torque (hereinafter called the spin torque) that rotates those magnetizations to be generated at the free layer or the fixed magnetization layer. The magnitude of this spin torque is proportional to the current density. As the voltage applied to the CPP-GMR device grows high, it causes the current density to grow large with the result that there is large spin torque. As the spin torque increases, there are problems such as changes in the direction of magnetization of the fixed magnetization layer, and the inability of the free layer to freely change the direction of magnetization with respect to an external magnetic field.

To solve such problems, Applicant has already filed Japanese Patent Application No. 2006-275972 to come up with an invention relating to a CPP-GMR device, with which large MR ratios are achieved while noise is held back and the influence of the spin torque is reduced.

That is, in a preferable embodiment of that invention, a spacer layer interleaved between the free layer and the fixed magnetization layer has typically a Cu/ZnO/Cu multilayer structure, and the area resistivity (AR) of a magneto-resistive effect device and the electro-conductivity of the spacer layer are determined in such a way as to fall within the given ranges.

By allowing the spacer layer to have typically a three-layer structure of Cu/ZnO/Cu according to this proposal, large MR ratios are achievable while holding back noise and reducing the influence of the spin torque.

The present invention of this application is to make improvements in or relating to Japanese Patent Application No. 2006-275972, and embodied as follows.

More specifically, as it is intended to restrict the area resistivity and electroconductivity of the device to within the given range as determined in Japanese Patent Application No. 2006-275972, the thickness of the semi-conductor layer used as the intermediate layer in the three-layer structure of the spacer layer and represented by ZnO must be as fine as about 1.2 to 1.6 nm. There would be no problem with such a range if that semiconductor layer is fabricated under strict fabrication and quality control management conditions; however, as the semiconductor layer represented by ZnO is too thin, pinholes occur due to film thickness variations during film formation, etc. This would possibly lead to a worsening of performance reliability due to such electro-migration as experienced in a so-called current-narrowing type CPP-GMR. There would be another possibility that at the time of polishing, Cu layers above and below ZnO may be short circuited, resulting in phenomena such as noise generation and deterioration of the MR change rates. Further, there would be likelihood of a disruption of crystal lattices due to film-formation conditions such as partial pressure of oxygen or the like. The thicker the film, the more noticeable this would be; that is, the volume fraction of a portion affected by the disruption of lattices would grow large as the film grows thin.

Thus, with design specifications where the semi-conductor layer used as the intermediate layer in the three-layer structure of the spacer layer is thin, there would be various troubles brought about.

For this reason, there is a demand for new specifications ensuring that the semiconductor layer used as the intermediate layer in the three-layer structure of the spacer layer can have a low device area resistivity as desired and be as thin as possible. New such specifications, of course, must ensure that there is ever higher MR performance obtained without having adverse influence on MR performance, or MR performance can be maintained at the same high level.

Note here that the prior art that seems to be most relevant to the invention of this application is JP-A-2003-8102. This prior art sets forth a CPP-GMR device comprising a fixed magnetization layer having a fixed magnetization direction, a free magnetization layer with its magnetization direction changing depending on an external magnetic field, a nonmagnetic metal intermediate layer interleaved between the fixed magnetization layer and the free magnetization layer, and a resistance control layer interleaved between the fixed magnetization layer and the free magnetization layer and formed of a material having conduction carriers of up to $10^{22}/cm^3$. The prior art shows a semiconductor as one of resistance control layer materials; however, it does not suggest at al about the requirements for the invention of this application.

SUMMARY OF THE INVENTION

The invention of this application provides a giant magneto-resistive effect device (CPP-GMR device) having a CPP (current perpendicular to plane) structure comprising a spacer layer, and a fixed magnetization layer and a free layer stacked one upon another with said spacer layer interposed between them, with a sense current applied in a stacking direction, wherein said free layer functions such that the magnetization direction changes depending on an external magnetic field, and said spacer layer comprises a first nonmagnetic metal layer and a second nonmagnetic metal layer, each formed of a nonmagnetic metal material, and a semiconductor layer interposed between the first nonmagnetic metal layer and the second nonmagnetic metal layer, and further comprises a work function control layer formed between said first nonmagnetic metal layer and said semiconductor layer and/or between said second nonmagnetic metal layer and said semiconductor layer, wherein said semiconductor layer is an n-type semiconductor, and said work function control layer is made of a material having a work function smaller than that of said first nonmagnetic metal layer, and said second nonmagnetic metal layer.

In a preferable embodiment of the magneto-resistive effect device of the invention, said first nonmagnetic metal layer and said second nonmagnetic metal layer are each Cu, said work function control layer is one selected from the group consisting of ZnCu, CrCu, MnCu, and TiCu, and said semiconductor layer is one selected from the group consisting of ZnO, ZnS, ZnSe, GaN, GaP, GaSb, and InSn.

In a preferable embodiment of the magneto-resistive effect device of the invention, said semiconductor layer is ZnO, and said work function control layer is ZnCu having a Zn content of 30 to 60 at %.

In a preferable embodiment of the magneto-resistive effect device of the invention, said semiconductor layer is ZnO, and said work function control layer is CrCu having a Cr content of 20 to 60 at %.

In a preferable embodiment of the magneto-resistive effect device of the invention, said semiconductor layer is ZnO, and said work function control layer is MnCu having a Mn content of 20 to 60 at %.

In a preferable embodiment of the magneto-resistive effect device of the invention, said semiconductor layer is ZnO, and said work function control layer is TiCu having a Ti content of 30 to 60 at %.

In a preferable embodiment of the magneto-resistive effect device of the invention, said work function control layer has a thickness of 0.3 nm to 1.20 nm.

In a preferable embodiment of the magneto-resistive effect device of the invention, that device has an area resistivity of 0.1 to 0.3 $\Omega \cdot m^2$.

The invention also provides a fabrication process for the aforesaid magneto-resistive effect device wherein, when said spacer layer is formed, a first nonmagnetic metal layer composed of Cu, a semiconductor layer composed of ZnO deficient in oxygen and a second nonmagnetic metal layer composed of Cu are sequentially formed by sputtering into a triple-layer structure, and thereafter, excessive Zn in the semiconductor layer is diffused by heat treatment toward the first nonmagnetic metal layer side and the second nonmagnetic metal layer, respectively, and a work function control layer composed of a ZnCu alloy is formed between the first nonmagnetic metal layer and the semiconductor layer, and between the second nonmagnetic metal layer and said semiconductor layer, respectively.

Further, the invention provides a thin-film magnetic head, comprising a plane opposite to a recoding medium, the aforesaid magneto-resistive effect device, which is located near said medium opposite plane for detecting a signal magnetic field from said recording medium, and a pair of electrodes for passing a current in the stacking direction of said magneto-resistive effect device.

Further, the invention provides a head gimbal assembly, comprising a slider including the aforesaid thin-film magnetic head and located in opposition to a recording medium, and a suspension adapted to resiliently support said slider.

Further, the invention provides a hard disk system, comprising a slider including the aforesaid thin-film magnetic head and located in opposition to a recording medium, and a positioning means adapted to support and position said slider with respect to said recording medium.

As described above, the invention a giant magneto-resistive effect device (CPP-GMR device) having a CPP (current perpendicular to plane) structure comprising a spacer layer, and a fixed magnetization layer and a free layer stacked one upon another with said spacer layer interposed between them, with a sense current applied in a stacking direction, wherein said free layer functions such that the magnetization direction changes depending on an external magnetic field, and said spacer layer comprises a first nonmagnetic metal layer and a second nonmagnetic metal layer, each formed of a nonmagnetic metal material, and a semiconductor layer interposed between the first nonmagnetic metal layer and the second nonmagnetic metal layer, and further comprises a work function control layer formed between said first nonmagnetic metal layer and said semiconductor layer and/or between said second nonmagnetic metal layer and said semiconductor layer, wherein said semiconductor layer is an n-type semiconductor, and said work function control layer is made of a material having a work function smaller than that of said first nonmagnetic metal layer, and said second nonmagnetic metal layer. It is thus possible to obtain by far more improved advantages: the semiconductor layer forming a part of the spacer layer can be so thicker than ever while keeping the area resistivity of the device low as desired (in other words, it is possible to keep the area resistivity of the device low as desired while making the semiconductor layer forming a part of the spacer layer thicker), ever higher MR performance is achievable, and the variation of the area resistivity of the device can be substantially held back with much more improvements in film performance.

EXPLANATION OF THE PREFERRED EMBODIMENTS

The best mode for carrying out the invention is now explained in details.

Figure 1:
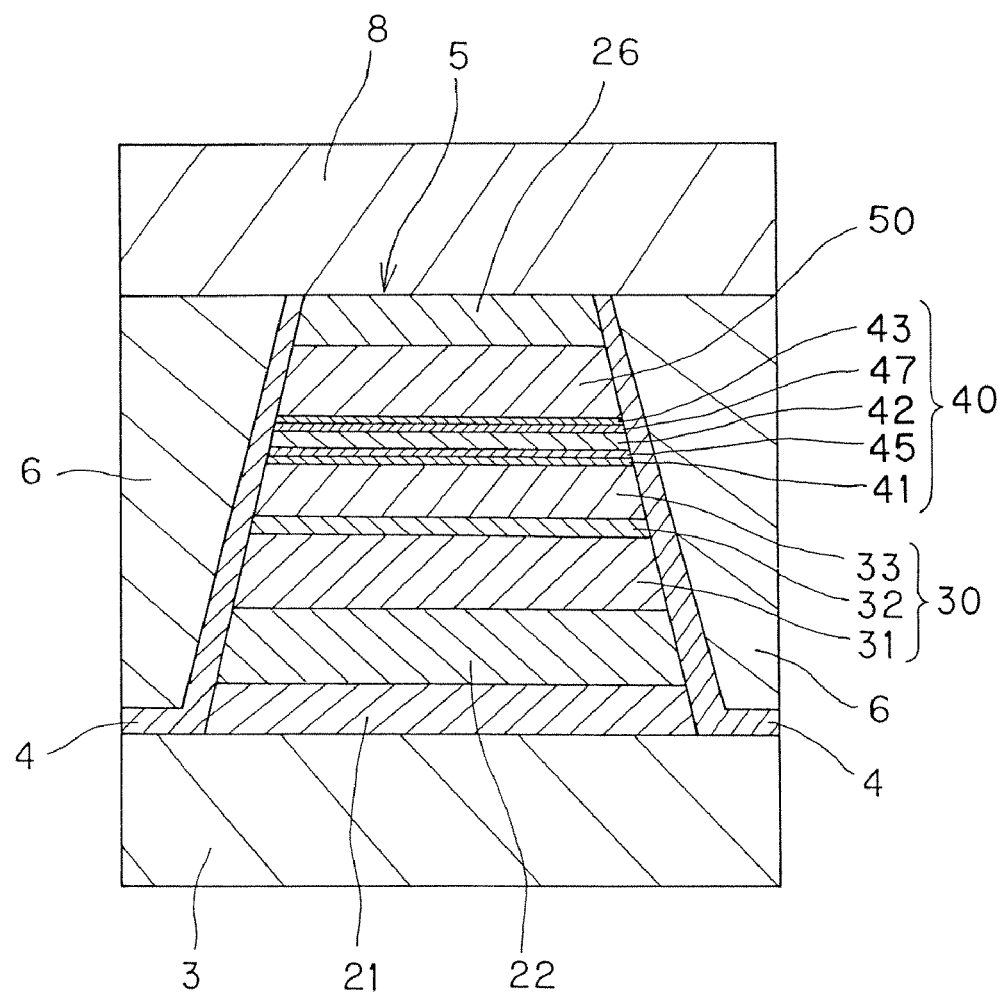
FIG. 1 is a sectional view illustrative of a section of an embodiment of the invention primarily parallel with the plane of a reproducing head in opposition to a medium.

FIG. 1 is illustrative of the ABS (air bearing surface) of the reproducing head in an embodiment of the invention; FIG. 1 is illustrative in schematic of the ABS of the giant magneto-resistive effect device (CPP-GMR device) having a CPP structure—part of the invention. The ABS is generally corresponding to a plane (hereinafter often called the medium opposite plane) at which a reproducing head is in opposition to a recording medium; however, it is understood that the ABS here includes even a section at a position where the multilayer structure of the device can be clearly observed. For instance, a protective layer of DLC (the protective layer adapted to cover the device) or the like, in a strict sense, positioned facing the medium opposite plane may be factored out, if necessary.

Figure 2:
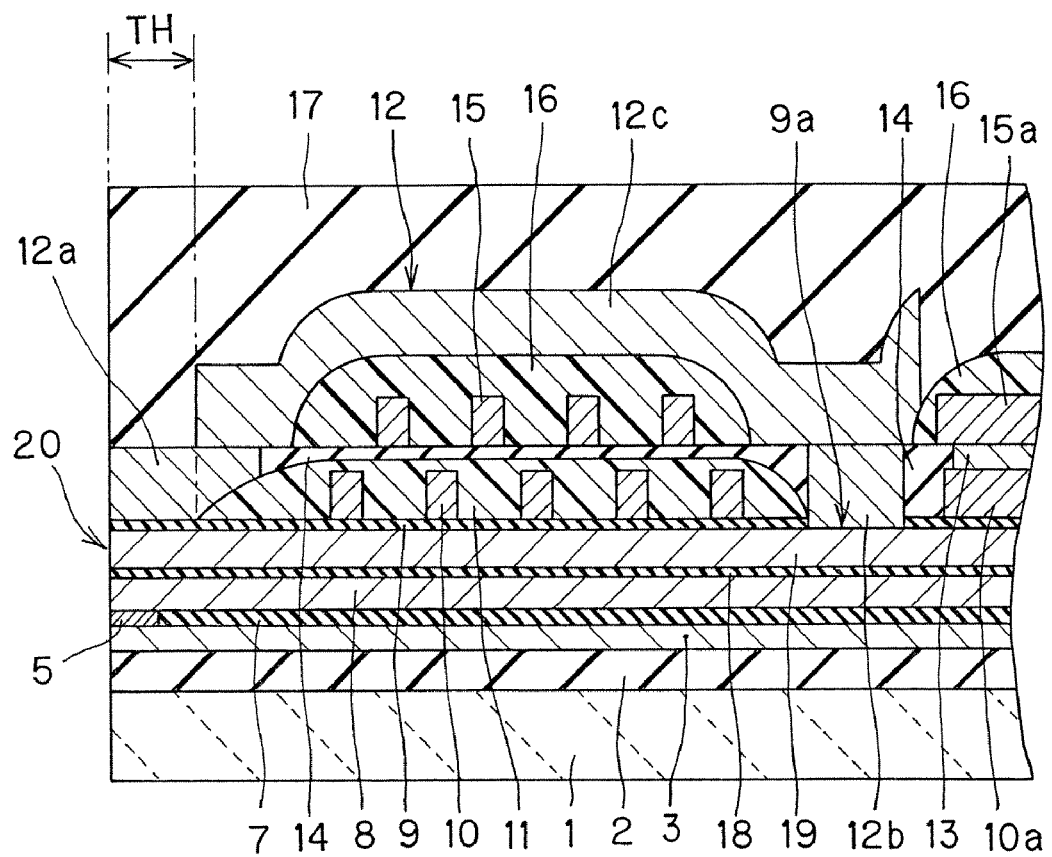
FIG. 2 is illustrative of the construction of a thin-film magnetic head according to one preferable embodiment of the invention; it is a sectional view illustrative of the plane of the thin-film magnetic head in opposition to the medium and a section thereof perpendicular to a substrate.

FIG. 2 is illustrative of the construction of the thin-film magnetic head according to one preferable embodiment of the invention; it is a sectional view illustrative of a section of the thin-film magnetic head perpendicular to the ABS and substrate.

Figure 3:
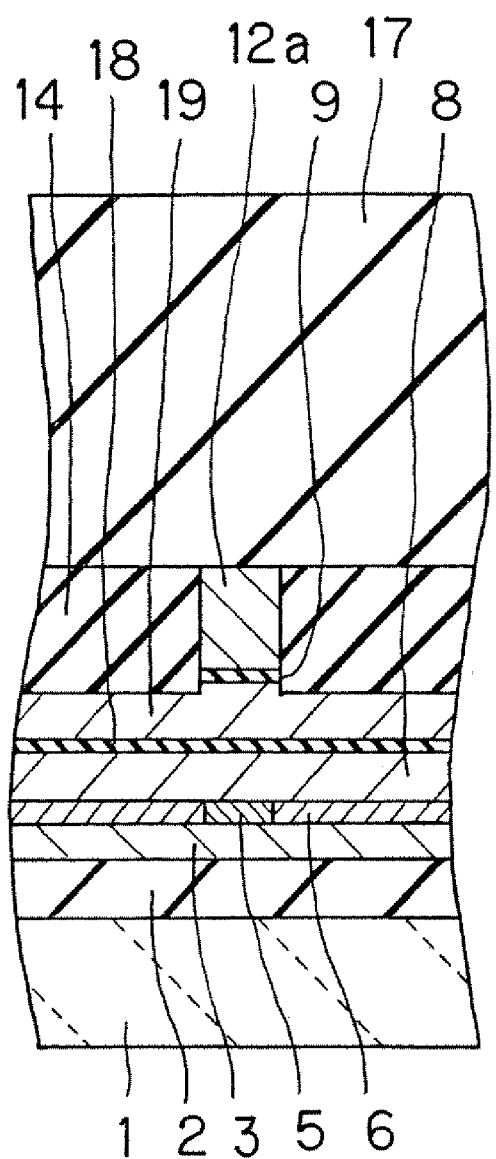
FIG. 3 is illustrative of the construction of the thin-film magnetic head according to one preferable embodiment of the invention; it is a sectional view illustrative of a section of a magnetic pole portion of the thin-film magnetic head parallel with the medium opposite plane.

FIG. 3 is illustrative of the construction of the thin-film magnetic head according to one preferable embodiment of the invention; it is a sectional view illustrative of a section of a magnetic pole portion of the thin-film magnetic head parallel with the ABS in particular.

Figure 4:
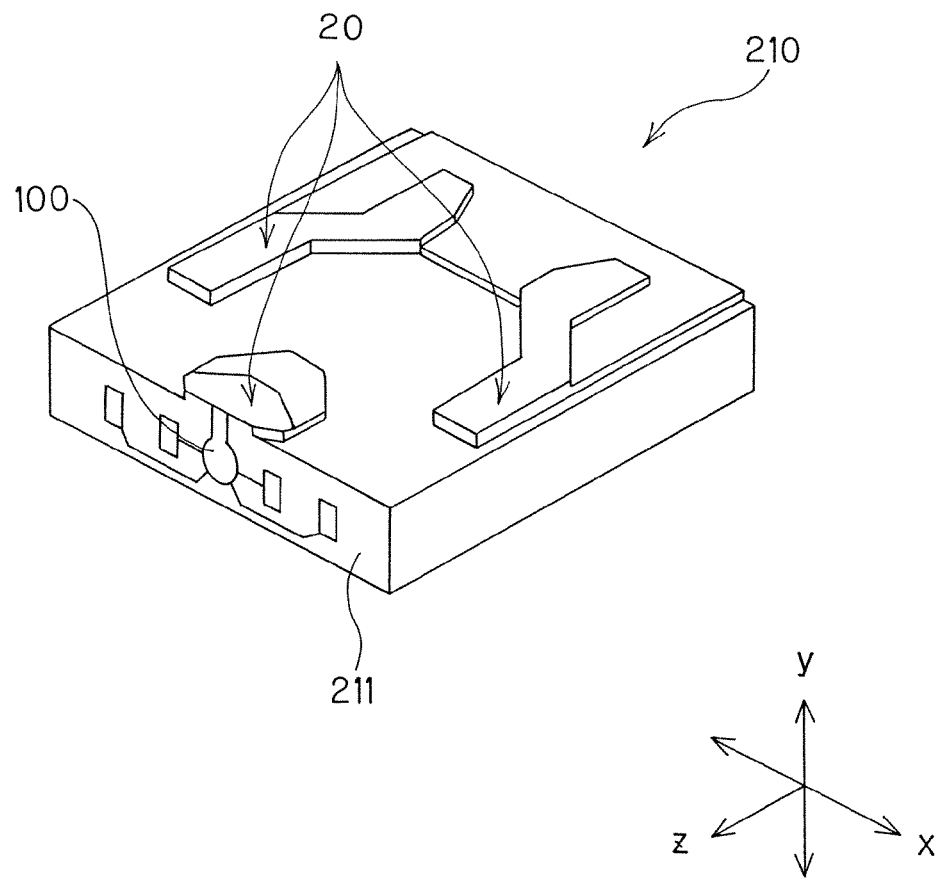
FIG. 4 is a perspective view of a slider built in the head gimbal assembly according to one embodiment of the invention.
Figure 5:
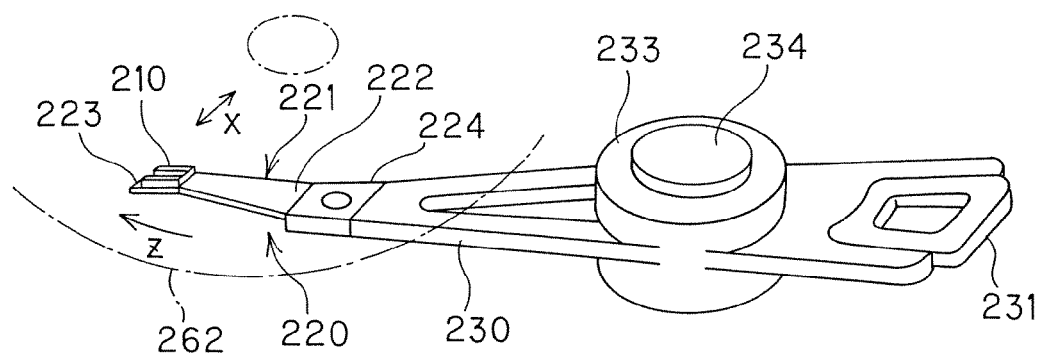
FIG. 5 is a perspective view of a head arm assembly including the head gimbal assembly according to one embodiment of the invention.
Figure 6:
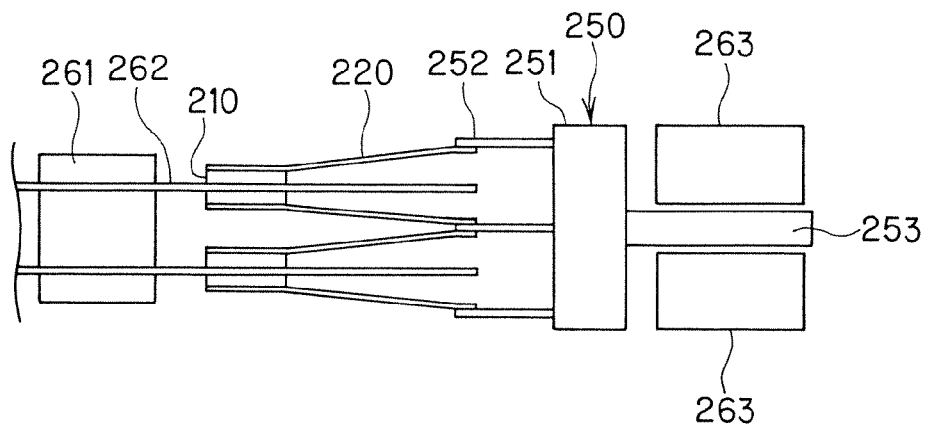
FIG. 6 is illustrative of part of the hard disk system according to one embodiment of the invention.
Figure 7:
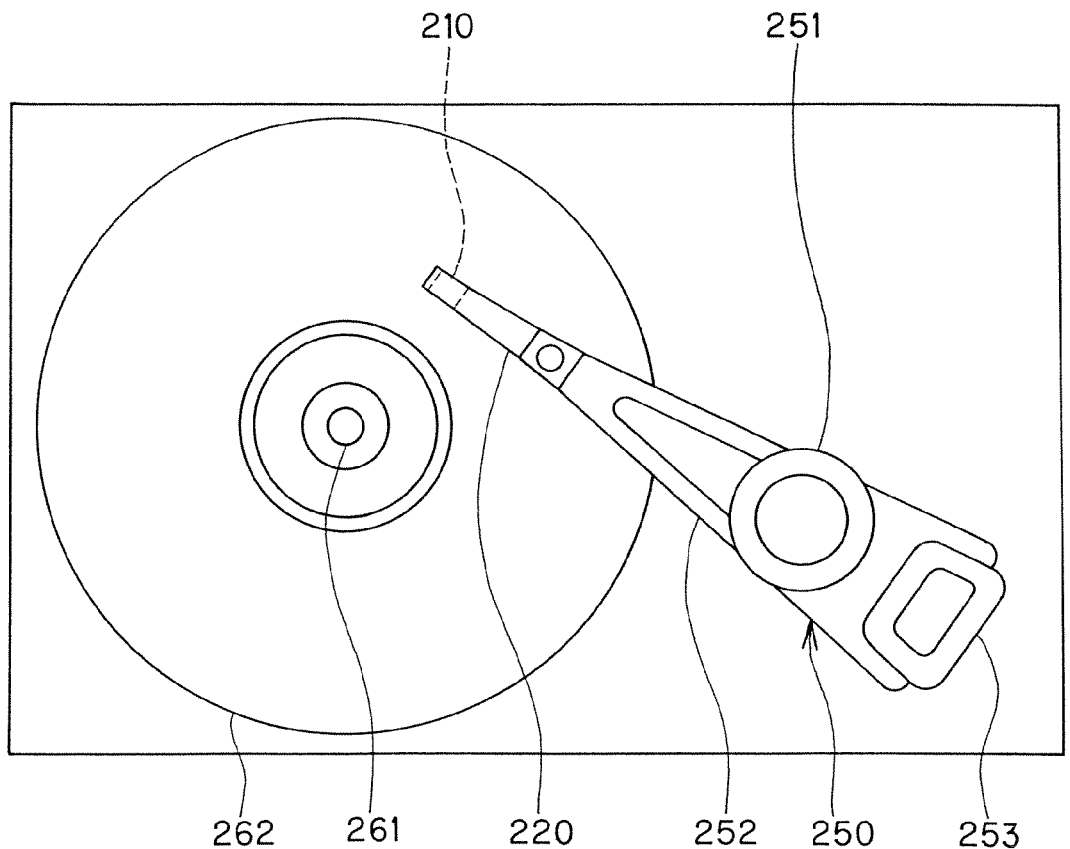
FIG. 7 is a plan view of the hard disk system according to one embodiment of the invention.

FIG. 4 is a perspective view of a slider built in the head gimbal assembly according to one embodiment of the invention; FIG. 5 is a perspective view of a head arm assembly including the head gimbal assembly according to one embodiment of the invention; FIG. 6 is illustrative of part of the hard disk system according to one embodiment of the invention; and FIG. 7 is a plan view of the hard disk system according to one embodiment of the invention.

[Giant Magneto-Resistive Effect Device (CPP-GMR Device) having a CPP Structure]

The construction of a reproducing head comprising the inventive giant magneto-resistive effect device (CPP-GMR device) having a CPP structure is now explained in details with reference to FIG. 1.

As noted above, FIG. 1 is a sectional view corresponding to a section of the reproducing head parallel with the medium opposite plane.

As shown in FIG. 1, the reproducing head according to the embodiment here comprises a first shield layer 3 and a second shield layer 8 that are located at a given space and opposed vertically on the sheet, a giant magneto-resistive effect device 5 (hereinafter referred to as the GMR device 5) interleaved between the first shield layer 3 and the second shield layer 8, an insulating film 4 adapted to cover two sides of the GMR device 5 and a part of the upper surface of the first shield layer 3 along these sides, and two bias magnetic field-applying layers 6 adjacent to the two sides of the GMR device 5 via the insulating layer 4.

In the embodiment here, the first 3 and the second shield layer 8 take a so-called magnetic shield role plus a pair-of-electrodes role. In other words, they have not only a function of shielding magnetism but also function as a pair of electrodes adapted to pass the sense current through the GMR device in a direction intersecting the plane of each of the layers forming the GMR device 5, for instance, in a direction perpendicular to the plane of each of the layers forming the GMR device (stacking direction).

Apart from the first 3 and the second shield layer 8, another pair of electrodes may be additionally provided above and below the GMR device.

The reproducing head of the invention includes the GMR device 5 having a CPP structure—part of the invention.

Referring to the inventive GMR device 5 having a CPP structure in terms of a broad, easy-to-understand concept, it comprises a spacer layer 40, and a fixed magnetization layer 30 and a free layer 50 that are stacked one upon another with the spacer layer 40 held between them, as shown in FIG. 1. And then, the sense current is applied to the GMR device 5 in its stacking direction to enable its function. In short, there is the GMR device 5 having a CPP (current perpendicular to plane) involved.

The free layer 50 has its magnetization direction changing dependent on an external magnetic field, viz., a signal magnetic field from a recording medium, while the fixed magnetization layer 30 has its magnetization direction fixed under the action of an antiferromagnetic layer 22. While an embodiment with the antiferromagnetic layer 22 formed on a bottom side (the side of the first shield layer 3) is shown in FIG. 1, it is contemplated that the antiferromagnetic layer 22 may be formed on a top side (the side of the second shield layer 8) to interchange the free layer 50 and the fixed magnetization layer 30 in position.

(Explanation of the Fixed Magnetization Layer 30)

In the invention, the fixed magnetization layer 30 is formed on the antiferromagnetic layer 22 having a pinning action via an underlay layer 21 formed on the first shield layer 3.

In a preferable embodiment of the invention, the fixed magnetization layer 30 has a so-called synthetic pinned layer comprising, in order from the side of the antiferromagnetic layer 22, an outer layer 31, a non-magnetic intermediate layer 32 and an inner layer 33, all stacked together in order.

The outer layer 31, and the inner layer 33 is provided by a ferromagnetic layer made of, for instance, a ferromagnetic material containing Co, and Fe. The outer 31 and the inner layer 32 are antiferromagnetically coupled and fixed such that their magnetization directions are opposite to each other.

The outer 31, and the inner layer 33 is preferably made of, for instance, a $Co_{70}Fe_{30}$ (at %) alloy. The outer layer has a thickness of preferably about 3 to 7 nm, and the inner layer 33 has a thickness of preferably about 3 to 10 nm. The inner layer 33 may also contain a Heusler alloy layer.

For instance, the nonmagnetic intermediate layer 32 is made of a nonmagnetic material containing at least one selected from the group consisting of Ru, Rh, Ir, Re, Cr, Zr and Cu, and has a thickness of, for instance, about 0.35 to 1.0 nm. The nonmagnetic intermediate layer 32 is provided to fix the magnetization of the inner layer 33 and the magnetization of the outer layer 31 in mutually opposite directions. The phrase "magnetization in mutually opposite directions" stands for a broad concept that encompasses just only two such magnetizations in just opposite directions of 180° but also those in different directions of 180°±20° as well.

(Explanation of the Free Layer 50)

The free layer 50 has its magnetization direction changing depending on an external magnetic field, i.e., a signal magnetic field from the recording medium, and is made of a ferromagnetic layer (soft magnetic layer) having a small coercive force. The free layer 50 has a thickness of, for instance, about 2 to 10 nm, and may be in either a single layer form or a multilayer form including a plurality of ferromagnetic layers. The free layer 50 may also contain a Heusler alloy layer.

On such free layer 50, there is a protective layer 26 formed, which comprises a Ta or Ru layer as an example, as shown in FIG. 1. The protective layer 26 has a thickness of about 0.5 to 20 nm.

(Explanation of the Spacer Layer 40)

In the embodiment of the invention shown in FIG. 1, the spacer layer 40 is built up of the first nonmagnetic metal layer 41 and the second nonmagnetic metal layer 43 with a semiconductor layer 42 interposed between the first 41 and the second nonmagnetic metal layer 43. The spacer layer 40 further comprises a work function control layer 45 between the first nonmagnetic metal layer 41 and the semiconductor layer 42 and a work function control layer 47 between the second nonmagnetic metal layer 43 and the semiconductor layer 42, respectively. As shown in FIG. 1, it is preferable to provide both the work function control layers 45 and 47, although it is acceptable to provide either one of them.

More specifically but not exclusively, the spacer layer 40 is embodied as:

(1) the first nonmagnetic metal layer 41/work function control layer 45/semiconductor layer 42/work function control layer 47/second nonmagnetic metal layer 43, (2) the first nonmagnetic metal layer 41/work function control layer 45/semiconductor layer 42/second nonmagnetic metal layer 43, and (3) the first nonmagnetic metal layer 41/semiconductor layer 42/work function control layer 47/second nonmagnetic metal layer 43.

As the "work function control layer 45, 47" here is inserted in the junction interface between the first nonmagnetic metal layer 41 and the semiconductor layer 42 and/or the junction interface between the second non-magnetic metal layer 43 and the semiconductor layer 42, it acts in such a way as to enhance the concentration of electrons at the junction interface thereby reducing junction resistance with the result that even when the semiconductor layer is made thin, the resistance value of the whole device can be diminished.

The "work function" has correlations to the "Fermi energy"; a large work function is tantamount to a low Fermi energy or a small work function to a high Fermi energy. The "work function" is defined as the minimum energy taken to force one electron from the crystal surface of a metal or semiconductor to just outside that surface.

When a metal contacts an n-type semiconductor and that metal has a high Fermi energy, electrons move from the metal side toward the semiconductor side so as to place the Fermi energy in order at the interface. Given the junction between a metal Cu and a semiconductor ZnO, the Fermi energy of Cu is 8.4 eV whereas the Fermi energy of ZnO is 4.2 eV. Hence, electrons move from Cu to the interface on the ZnO side, resulting in an increase in the concentration of electrons at the interface. In other words, if the work function control layer having a Fermi energy higher than that of Cu is interposed between Cu and ZnO, it would then be possible to lower the junction resistance of the interface with the result that the ZnO semiconductor layer could be thicker.

Therefore, the work function control layer 45, 47 is made of a material whose work function's value is smaller than that of the material of which the first 41, and the second nonmagnetic metal layer 43 is made.

In the invention, the semiconductor layer 42 is made of an n-type semiconductor.

(Specific Construction of the Spacer Layer 40 in the Invention)

The specific construction of the spacer layer 40 in the invention is now explained at great length.

(First 41, and Second Nonmagnetic Metal Layer 43)

The first 41 and the second nonmagnetic metal layer 43 are each made of Cu at a thickness of 0.3 to 2.0 nm, preferably 0.5 to 1.0 nm. At a thickness of less than 0.3 nm, the MR ratio becomes low. A possible reason for this could be that as the first, and the second nonmagnetic metal layer is too thin, it causes the first, and the second nonmagnetic metal layer not to grow continuously; that is, it grows in island form with the result that spin-polarized electrons are likely to scatter. At too large a thickness of greater than 3.0 nm, the MR ratio again becomes low. In this case, too, some scattering of spin-polarized electrons in the first, and the second non-magnetic metal layer would take part.

One surface of such first 41, and second nonmagnetic metal layer 43 (that faces away from its surface in contact with the work function control layer 45, 47) is in contact with the aforesaid fixed magnetization layer 30 and free layer 50, each a ferromagnetic layer; however, to generate spin-polarized conduction electrons, the first 41, and the second nonmagnetic metal layer 43 must be made of Cu, and there must be none of impurities at the interface. In the embodiment shown typically in FIG. 1, the first nonmagnetic metal layer 41 lies on the fixed magnetization layer 30 side while the second nonmagnetic metal layer 43 lies on the free layer 50 side.

(Semiconductor Layer 42)

The semiconductor layer 42 is made up in the form of an n-type semiconductor comprising one selected from the group consisting of ZnO, ZnS, ZnSe, GaN, GaP, GaSb, and InSn, although ZnO is most preferred.

In the invention, by the insertion of the work function control layers 45 and 47, the junction resistance can be so lowered that the device can have the desired low area resistivity AR while the semiconductor layer 42 is kept thin.

When the semiconductor layer 42 is made of ZnO, its thickness is set at about 1.2 to 2.0 nm.

(Work Function Control Layers 45, 47)

Preferably, the work function control layers 45 and 47 are each made of one selected from the group consisting of ZnCu, CrCu, MnCu, and TiCu, as will be explained for each.

(i) When the first 41 and the second nonmagnetic metal layer 43 are each made of Cu and the semiconductor layer 42 is made of ZnO as noted above as well as a ZnCu alloy is used as each of the work function control layers 45 and 47, the content of Zn in that ZnCu alloy should be 30 to 60 at %, preferably 40 to 50 at %. At Zn contents short of 30 at %, there is inconvenience: the magnitude of the Fermi energy of the ZnCu alloy becomes insufficient to take effect on lowering the junction resistance at the interface, resulting in the inability to make the semiconductor layer thick. At Zn contents exceeding 60 at %, on the other hand, there is inconvenience: deterioration of the MR ratio.

(ii) When the first 41 and the second nonmagnetic metal layer 43 are each made of Cu and the semiconductor layer 42 is made of ZnO as noted above as well as a CrCu alloy is used as each of the work function control layers 45 and 47, the content of Cr in that CrCu alloy should be 20 to 60 at %, preferably 30 to 50 at %. At Cr contents short of 20 at %, there is inconvenience: the magnitude of the Fermi energy of the CrCu alloy becomes insufficient to take effect on lowering the junction resistance at the interface, resulting in the inability to make the semiconductor layer thick. At Cr contents exceeding 60 at %, on the other hand, there is inconvenience: deterioration of the MR ratio.

(iii) When the first 41 and the second nonmagnetic metal layer 43 are each made of Cu and the semiconductor layer 42 is made of ZnO as noted above as well as a MnCu alloy is used as each of the work function control layers 45 and 47, the content of Mn in that MnCu alloy should be 20 to 60 at %, preferably 30 to 50 at %. At Mn contents short of 20 at %, there is inconvenience: the magnitude of the Fermi energy of the MnCu alloy becomes insufficient to take effect on lowering the junction resistance at the interface, resulting in the inability to make the semiconductor layer thick. At Mn contents exceeding 60 at %, on the other hand, there is inconvenience: deterioration of the MR ratio.

(iv) When the first 41 and the second nonmagnetic metal layer 43 are each made of Cu and the semiconductor layer 42 is made of ZnO as noted above as well as a TiCu alloy is used as each of the work function control layers 45 and 47, the content of Ti in that ZnCu alloy should be 30 to 60 at %, preferably 40 to 50 at %. At Ti contents short of 30 at %, there is inconvenience: the magnitude of the Fermi energy of the TiCu alloy becomes insufficient to take effect on lowering the junction resistance at the interface, resulting in the inability to make the semiconductor layer thick. At Ti contents exceeding 60 at %, on the other hand, there is inconvenience: deterioration of the MR ratio.

It is here noted that even with the replacement of ZnO of the semiconductor layer 42 by ZnS, ZnSe, GaN, GaP, GaSb, InSn or the like, there are similar tendencies observed as in (i), (ii), (iii) and (iv) above.

Preferably, the work function control layers 45, 47 have each a thickness of at least one single atom film, especially 0.3 nm to 1.20 nm, and more especially 0.5 nm and 1.0 nm. As this thickness is less than one single atom film, it causes inconvenience: loss of the function that the work function control layer should have. As it exceeds 1.20 nm, on the other hand, there is some scattering of spin-polarized electrons leading to deterioration of the MR ratio.

The electroconductivity of the spacer layer 40 constructed as described above is desirously in the range of 133 to 432 (S/cm), preferably 200 to 350 (S/cm). The electroconductivity of the spacer layer 40 here is defined as the reciprocal of the resistivity ($\Omega \cdot cm$) of the spacer layer 40.

The spacer layer as described above may be formed by forming the respective component layers by sputtering in order, using targets of appropriate compositions. After film formation, the thin film is usually subjected to given heat treatment for the purpose of crystallizing the semiconductor layer thereby making its resistance low. The "after film formation" means both after the formation of the semiconductor layer and after the formation of the whole device. Usually, the heat treatment is carried out after the formation of the whole device.

By way of example but not by way of limitation on material, the space layer, if built up in the form of (the first nonmagnetic metal layer: Cu/work function control layer: ZnCu/semiconductor layer: ZnO/work function control layer: ZnCu/second nonmagnetic metal layer: Cu), is preferably fabricated by the following simplified process steps.

That is to say, when the spacer layer is formed, the first nonmagnetic metal layer composed of Cu, the semiconductor layer composed of ZnO deficient in oxygen (in other words, the Zn-enriched ZnO semiconductor layer) and the second nonmagnetic metal layer composed of Cu are first sequentially formed by sputtering into a triple-layer structure. Specifically, there is Cu/ZnO (deficient in oxygen)/Cu involved. Note here that the semiconductor layer composed of ZnO deficient in oxygen may be formed by sputtering using an oxygen-deficient ZnO target as it stands or, alternatively, heat treatment at about 200 to 300% in a vacuum in a chamber just after film formation.

After such a triple-layer structure is formed, excessive Zn in the semiconductor layer is diffused by heat treatment toward the first nonmagnetic metal layer side and the second nonmagnetic metal layer side, respectively, and the work function control layers composed of a ZnCu alloy are formed between the first non-magnetic metal layer and the semiconductor layer, and between the second nonmagnetic metal layer and that semiconductor layer, respectively.

Heat treatment may be carried out at a temperature capable of forming the desired ZnCu alloy by diffusion, for instance, 230° C. to 320° C., preferably 280° C. to 300° C. Thus, by forming the work function control layer by means of thermal diffusion, the process steps can be much more simplified.

(Explanation of the Antiferromagnetic Layer 22)

The antiferromagnetic layer 22 works such that by way of exchange coupling with the fixed magnetization layer 30 as described above, the magnetization direction of the fixed magnetization layer 30 is fixed.

For instance, the antiferromagnetic layer 22 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that comes to show anti-ferromagnetism by heat treatment. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 22 has a thickness of about 5 to 30 nm.

It is here noted that for the layer for fixing the magnetization direction of the fixed magnetization layer 30, it is acceptable to use a hard magnetic layer comprising a hard magnetic material such as CoPt in place of the aforesaid antiferromagnetic layer.

The underlay layer 21 formed below the anti-ferromagnetic layer 22 is provided to improve the crystallization and orientation of each of the layers stacked on it in general, and the exchange coupling of the antiferromagnetic layer 22 and the fixed magnetization layer 30 in particular. For such underlay layer 21, for instance, a multilayer structure of Ta and NiCr layers is used. The underlay layer 21 has a thickness of about 2 to 6 nm as an example.

In the invention, the area resistivity, AR, of the magneto-resistive effect device 5 (CPP-GMR device 5) is in the range of 0.1 to 0.3 $\Omega \cdot \mu m^2$, preferably 0.12 to 0.3 $\Omega \cdot \mu m^2$, and more preferably 0.14 to 0.28 $\Omega \cdot \mu m^2$. Any deviation from the range of 0.1 to 0.3 $\Omega \cdot \mu m^2$ would make it difficult to obtain large MR ratios while reducing noise and holding back the influences of spin torque.

The device (CPP-GMR device) to be measured for its area resistivity is a multilayer arrangement comprising the underlay layer 21, antiferromagnetic layer 22, fixed magnetization layer 30, spacer layer 40, free layer 50 and protective layer 26, as shown in FIG. 1.

Referring now to the insulating layer 4 shown in FIG. 1, it is made of an alumina material as an example. For the bias magnetic field-applying layer 6, for instance, use is made of a hard magnetic layer (hard magnet) or a multilayer arrangement of a ferromagnetic layer and an antiferromagnetic layer, specifically, CoPt, and CoCrPt.

The giant magneto-resistive effect device (CPP-GMR device) of the CPP structure in the embodiment of the invention as described above may be formed by means of vacuum film-formation techniques such as sputtering. If required, heat treatment may be applied after film-formation.

(Explanation of the Whole Construction of the Thin-Film Magnetic Head)

The whole construction of the thin-film magnetic head comprising the aforesaid magneto-resistive effect device is now explained. As already mentioned, FIGS. 2 and 3 are illustrative of the construction of the thin-film magnetic head according to one preferred embodiment of the invention; FIG. 2 is illustrative of a section of the thin-film magnetic head perpendicular to the ABS and a substrate and FIG. 3 is illustrative of a section of a magnetic pole portion of the thin-film magnetic head parallel with the ABS.

The whole structure of the thin-film magnetic head will be better understood when consideration is given to its fabrication process steps; the whole structure of the thin-film magnetic head is now explained with reference to its fabrication process steps.

First of all, an insulating layer 2 comprising an insulating material such as alumina ($Al_2O_3$) or silicon dioxide ($SiO_2$) is formed by sputtering or like techniques on a substrate 1 comprising a ceramic material such as AlTiC ($Al_2O_3 \cdot TiC$). That insulating layer has a thickness of about 0.5 to 20 μm as an example.

Then, a lower shield layer 3 comprising a magnetic material and adapted for a reproducing head is formed on that insulating layer 2. The shield layer 3 has a thickness of about 0.1 to 5 μm as an example. The magnetic material used for such lower shield layer 3, for instance, includes FeAlSi, NiFe, CoFe, CoFeNi, FeN, FeZrN, FeTaN, CoZrNb, and CoZrTa. The lower shield layer 3 is formed by sputtering, plating or like other techniques.

Then, a reproducing CPP-GMR device 5 is formed on the lower shield layer 3.

Although not shown, an insulating film is then formed in such a way as to cover two sides of the MR device and the upper surface of the first shield layer 3. The insulating film is formed of an insulating material such as alumina.

Then, two bias magnetic field-applying layers 6 are formed in such a way as to be adjacent to the two sides of the MR device 5 via the insulating layer. Then, an insulating film 7 is formed in such a way as to be located around the CPP-GMR device 5 and bias magnetic field-applying layers 6. The insulating film 7 is formed of an insulating material such as alumina.

Then, a second shield layer 8 for the reproducing head, comprising a magnetic material, is formed on the bias magnetic field-applying layers 6 and insulating layer 7. The second shield layer 8, for instance, is formed by means of plating or sputtering.

Then, a separation layer 18 comprising an insulating material such as alumina is formed by sputtering or the like on the upper shield layer 8. Then, a lower magnetic pole layer 19, comprising a magnetic material and adapted for a recording head, is formed by plating, sputtering or the like on the separation layer 18. The magnetic material used for the second shield layer 8, and the lower magnetic pole layer 19, for instance, includes a soft magnetic material such as NiFe, CoFe, CoFeNi, and FeN. It is here noted that instead of the multilayer arrangement of the second shield layer 8, separation layer 18 and lower magnetic pole layer 19, it is acceptable to configure the second shield layer in such a way as to work also as a lower electrode layer.

Then, a recording gap layer 9 comprising a non-magnetic material such as alumina is formed by sputtering or the like on the lower magnetic pole layer 19. That recording gap layer has a thickness of about 50 to 300 nm.

For the formation of a magnetic path, the recording gap layer 9 is then partially etched at the center of the thin-film coil to be described later to form a contact hole 9a.

Then, a first layer portion 10 of the thin-film coil, typically comprising copper (Cu), is formed on the recording gap layer 9 at a thickness of typically 2 to 3 µm. In FIG. 2, note that reference numeral 10a stands for a connector portion of the first layer portion 10, which is to be connected to a second layer portion 15 of the thin-film coil to be described later. The first layer portion 10 is wound around the contact hole 9a.

Then, an insulating layer 11 comprising a photo-resist or other organic material having fluidity upon heating is formed in such a given pattern as to cover the first layer portion 10 of the thin-film coil and the surrounding recording gap layer 9.

Then, the insulating layer 11 is heat treated at a given temperature to make its surface flat. By this heat treatment, each of the edge portions of the outer and inner peripheries of the insulating layer 11 is configured into a rounded slant.

Then, in an area of the insulating layer 11 from a slant portion on the medium opposite plane 20 (to be described later) side to the medium opposite plane 20 side, a track width-setting layer 12a of an upper magnetic pole layer 12 is formed on the recording gap layer 9 and insulating layer 11, using the magnetic material for the recording head. The upper magnetic pole layer 12 is made up of that track width-setting layer 12a, and a coupler portion layer 12b and a yoke portion layer 12c to be described later.

The track width-setting layer 12a is formed on the recording gap layer 9, including an end portion that provides a magnetic pole portion of the upper magnetic pole layer 12 and a connector portion that is formed on the slant portion of the insulating layer 11 on the medium opposite plane 20 side and connected to the yoke portion layer 12c. The width of that end portion is set equal to the recording track width, and the width of the connector portion is greater than the width of the end portion.

Simultaneously with the formation of the track width-setting layer 12a, the coupler portion 12b comprising a magnetic material is formed on the contact hole 9a and a connector layer 13 comprising a magnetic material is formed on the connector portion 10a. The coupler portion layer 12b forms a portion of the upper magnetic pole layer 12, which is to be magnetically connected to the upper shield layer 18.

Then, magnetic pole trimming is carried out. That is, in an area around the track width-setting layer 12a, the track width-setting layer 12a is used as a mask to etch at least a part of the recording gap layer 9 and the magnetic pole portion of the upper shield layer 8 on the recording gap layer 9 side, whereby, as shown in FIG. 3, there is a trim structure formed, in which at least a part of the magnetic pole portion of the upper magnetic pole layer 12, the recording gap layer 9 and the magnetic pole portion of the upper shield layer 8 has a uniform width. This trim structure makes sure prevention of an effective increase in the track width due to the spread of a magnetic flux near the recording gap layer 9.

Then, an insulating layer 14 comprising alumina or other inorganic insulating material is formed around the whole at a thickness of typically 3 to 4 nm.

Then, that insulating layer 14 is polished by chemo-mechanical polishing or the like as far as the surfaces of the track width-setting layer 12a, coupler portion layer 12b and connector layer 13 for flattening.

Then, the second layer portion 15 of the thin-film coil typically comprising copper (Cu) is formed on the flattened insulating layer 14 at a thickness of typically 2 to 3 µm. In FIG. 2, note that reference numeral 15a is indicative of a connector portion of the second layer portion 15, which is to be connected to the connector portion 10a of the first layer portion 10 of the thin-film coil by way of the connector layer 13. The second layer portion 15 is wound around the coupler portion layer 12b.

Then, an insulating layer 16 comprising a photo-resist or other organic material having fluidity upon heating is formed in such a given pattern as to cover the second layer portion 15 of the thin-film coil and the surrounding insulating layer 14.

Then, the insulating layer 16 is heat treated at a given temperature to make its surface flat. By this heat treatment, each of the edge portions of the outer and inner peripheries of the insulating layer 16 is configured into a rounded slant.

Then, the magnetic material for the recording head such as permalloy is used to form the yoke portion layer 12c forming the yoke portion of the upper magnetic layer 12 on the track width-setting layer 12a, insulating layers 14, 16 and coupler portion layer 12b. An end of the yoke layer portion 12c on the medium opposite plane 20 side is spaced away from the medium opposite plane 20, and the yoke portion layer 12c is connected to the lower magnetic pole layer 19 by way of the coupler portion layer 12b.

Then, an overcoat layer 17 typically comprising alumina is formed in such a way as to cover the whole. Finally, a slider including the aforesaid respective layers is machined to form the medium opposite plane 20 of the thin-film head including the recording head and reproducing head in the form of a complete thin-film magnetic head.

The thus fabricated thin-film magnetic head comprises the medium opposite plane 20 in opposition to the recording medium, the aforesaid reproducing head, and the recording head (induction type of magnetic device).

The magnetic head comprises the magnetic lower and upper magnetic pole layers 19 and 12 that include mutually opposite magnetic pole portions on the medium opposite plane 20 side and are magnetically coupled to each other, the recording gap layer 9 located between the magnetic pole portion of the lower magnetic pole layer 19 and the magnetic pole portion of the upper magnetic pole layer 12, and the thin films 10, 15 at least a part of which is located between the lower 19 and the upper magnetic pole layer 12 while insulated from them.

As shown in FIG. 2, such a thin-film magnetic head has a throat height (indicated by TH in the drawing) that is defined by a length from the medium opposite plane 20 up to the end of the insulating layer 11 on the medium opposite plane side. In other words, the "throat height" means a length (height)

from the medium opposite plane 20 to a position at which the two magnetic pole layers start being spaced away.

(Explanation of How the Thin-Film Magnetic Head Works)

How the thin-film magnetic head according to the embodiment here works is now explained. The thin-film magnetic head records information in the recording medium by the recording head, and plays back the information recorded in the recording medium by the reproducing head.

At the reproducing head, the direction of a bias magnetic field applied by the bias magnetic field-applying layers 6 is orthogonal to the direction perpendicular to the medium opposite plane 20. At the CPP-GMR device 5 with no signal magnetic field applied yet, the magnetization direction of the free layer 50 lies in the direction of the bias magnetic field, and the magnetization direction of the fixed magnetization layer 30 is fixed in the direction perpendicular to the medium opposite plane 20.

At the CPP-GMR device 5, there is a change in the magnetization direction of the free layer 50 depending on a signal magnetic field from the recording medium, which in turn causes a change in the relative angle between the magnetization direction of the free layer 50 and the magnetization direction of the fixed magnetization layer 30, with the result that there is a change in the resistance value of the CPP-GMR device 5. The resistance value of the CPP-GMR device 5 may be found from a potential difference between the first and second shield layers, i.e., the two electrode layers 3 and 8 at the time when the sense current is passed through the MR device. It is thus possible for the reproducing head to play back the information recorded in the recording medium.

(Explanation of the Head Gimbal Assembly and the Hard Disk System)

The head gimbal assembly and the hard disk system according to the embodiment here are now explained.

A slider 210 included in the head gimbal assembly is first explained with reference to FIG. 4. In the hard disk system, the slider 210 is located in such a way as to face a hard disk that is a rotationally driven disk-form recording medium. This slider 210 primarily comprises a substrate 211 built up of a substrate 1 and an overcoat 24 depicted in FIG. 2.

The substrate 211 is in a generally hexahedral shape. Of the six surfaces of the substrate 211, one surface is in opposition to the hard disk. On that one surface there is a medium opposite plane 20 formed.

As the hard disk rotates in the z-direction in FIG. 4, it causes an air flow passing between the hard disk and the slider 210 to induce lift relative to the slider 210 in the downward y-direction in FIG. 4. This lift in turn causes the slider 210 to levitate over the surface of the hard disk. Note here that the x-direction in FIG. 4 traverses tracks on the hard disk.

Near the end of the slider 210 on an air exit side (the left lower end in FIG. 4), there is the thin-film magnetic head 100 formed according to the invention.

A head gimbal assembly 220 according to this embodiment is now explained with reference to FIG. 5. The head gimbal assembly 220 comprises a slider 210 and a suspension 221 adapted to resiliently support that slider 210. The suspension 221 comprises a leaf spring-form load beam 222 formed typically of stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

FIG. 5 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One example of the head stack assembly and the hard disk system according to the instant embodiment are now explained with reference to FIGS. 6 and 7.

FIG. 6 is illustrative of part of the magnetic disk system, and FIG. 7 is a plan view of the hard disk system.

A head stack assembly 250 comprises a carriage 251 having a plurality of arms 252. The plurality of arms 252 are provided with a plurality of the head gimbal assemblies 220 such that they line up vertically at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the magnetic disk system here have pretty much the same action as the thin-film magnetic head according to the foregoing embodiment.

While the embodiment here has been described with reference to the thin-film magnetic head of the structure wherein the reproducing head is located on the substrate side and the recording head is stacked on the reproducing head, it is contemplated that that order of stacking could be reversed. When the thin-film magnetic head here is used as a read-only head, the recording head could be removed from it.

It is also contemplated that part of the invention may be applied not only to magnetic heads but also as a so-called thin-film magnetic field sensor adapted to detect a magnetic field.

The CPP-GMR device as described above is now explained in more details with reference to the following specific experimental examples.

Experimental Example 1

Inventive CPP-GMR device samples having such a multilayer structure as shown in Table 1 were formed by sputtering, ready for experimentation. More specifically, such various samples as set out in Tables 2 to 5 were prepared with varied alloy materials (ZnCu, CrCu, MnCu, TiCu) for the work function control layers forming a part of the spacer layer at varied composition ratios (at %) of the alloys for the work function control layers.

It is here noted that the work function control layer-free samples (Z-1, R-1, M-1, T-1) were all the same, with none of the work function control layers and the thickness of the first nonmagnetic metal layer Cu set at 0.6 nm.

Each of such various CPP-GMR device samples as set out in Tables 2 to 5 was measured and estimated according to the following procedures about (1) the MR ratio, (2) the area resistivity AR ($\Omega \cdot \mu m^2$) of the device, and (3) the electroconductivity (S/cm) of the spacer layer.

(1) MR ratio

The MR ratio was measured by an ordinary dc four-terminal method. The MR ratio is represented by $\Delta R/R$ where $\Delta R$ is indicative of the amount of resistance change, and R is indicative of a resistance value. The figure, because of being small, is indicated in terms of percentage.

Note here that the MR ratio was found as an average of 100 samples.

(2) Area Resistivity AR ($\Omega \cdot \mu m^2$) of the Device

The area resistivity was measured by a dc four-terminal method.

(3) Electroconductivity (S/cm) of the Spacer Layer

First, the resistivity ($\Omega \cdot cm$) of the spacer layer 40 was found by subtracting from the area resistivity of a CPP-GMR device sample the area resistivity other than that of the spacer layer 40, the contact area resistivity (0.2 m$\Omega \cdot \mu m^2$) of the interface of the spacer layer Cu/free layer CoFe and the contact area resistivity (0.2 m$\Omega \cdot \mu m^2$) of the interface of the spacer layer Cu/fixed magnetization layer CoFe. Then, the resultant value is divided by the thickness of the spacer layer 40 to find the resistivity ($\Omega \cdot cm$) of the spacer layer 40. The electroconductivity (S/cm) of the spacer layer 40 is worked out as the reciprocal of the resistivity ($\Omega \cdot cm$) of the spacer layer 40.

The area resistivities other than the area resistivity of the spacer layer 40 here were about 0.03 $\Omega \cdot \mu m^2$.

TABLE 1

| Multilayer structure | | Layer material | Thickness (nm) |
|---|---|---|---|
| Protective layer | | Ru | 2.0 |
| Free layer | | Co70Fe30 | 4.0 |
| Spacer layer | Second nonmagnetic metal layer | Cu | 0.7 |
| | Semiconductor layer | ZnO | 1.4 |
| | Work function control layer | ZnCu, CrCu, MnCu or TiCu | 0.6 |
| | First nonmagnetic metal layer | Cu | 0.7 |
| Fixed magnetization Layer | Inner layer | Co70Fe30 | 3.5 |
| | Nonmagnetic intermediate layer | Ru | 0.7 |
| | Outer layer | Co70Fe30 | 3.0 |
| Antiferromagnetic layer | | IrMn | 5.0 |
| Underlay layer | | NiCr | 4.0 |

TABLE 2

(ZnCu)

| Sample No. | Work function control layer ZnCu | Area resistivity of the device AR ($\Omega \cdot \mu m^2$) | MR ratio (%) | Eelectroconductivity of the spacer layer (S/cm) |
|---|---|---|---|---|
| Z-1 | — | 0.22 | 8.7 | 211 |
| Z-2 | Zn30Cu70 | 0.17 | 8.8 | 287 |
| Z-3 | Zn60Cu40 | 0.16 | 8.6 | 309 |
| Z-4 | Zn80Zn20 | 0.20 | 5.2 | 236 |

From the results set out in Table 2, it is found that by interposing between the first nonmagnetic metal layer and the semiconductor layer the work function control layer composed of a ZnCu alloy having a Zn content of 30 to 60 at %, the area resistivity AR of the device can be 23% to 27% reduced while the MR ratio is kept at 8.0 or greater.

It is thus possible to make the semiconductor layer thicker than that in the prior art structure while the area resistivity of the device is kept at much the same level.

It is also found that with the work function control layer having a thickness in the range of 0.3 nm to 1.20 nm, the advantages of the invention are achievable as described above.

TABLE 3

(CrCu)

| Sample No. | Work function control layer CrCu | Area resistivity of the device ($\Omega \cdot \mu m^2$) | MR ratio (%) | Electroconductivity of the spacer layer (S/cm) |
|---|---|---|---|---|
| R-1 | — | 0.22 | 8.7 | 211 |
| R-2 | Cr20Cu80 | 0.18 | 8.6 | 241 |
| R-3 | Cr30Cu70 | 0.17 | 8.5 | 287 |
| R-4 | Cr60Cu40 | 0.16 | 8.1 | 309 |
| R-5 | Cr80Zn20 | 0.20 | 4.3 | 236 |

From the results set out in Table 3, it is found that by interposing between the first nonmagnetic metal layer and the semiconductor layer the work function control layer composed of a CrCu alloy having a Cr content of 20 to 60 at %, the area resistivity AR of the device can be 18% to 27% reduced while the MR ratio is kept at 8.0 or greater.

It is thus possible to make the semiconductor layer thicker than that in the prior art structure while the area resistivity of the device is kept at much the same level.

It is also found that with the work function control layer having a thickness in the range of 0.3 nm to 1.20 nm, the advantages of the invention are achievable as described above.

TABLE 4

(MnCu)

| Sample No. | Work function control layer MnCu | Area resistivity AR of the device ($\Omega \cdot \mu m^2$) | MR ratio (%) | Electroconductivity of the spacer layer (S/cm) |
|---|---|---|---|---|
| M-1 | — | 0.22 | 8.7 | 211 |
| M-2 | Mn20Cu80 | 0.18 | 8.6 | 241 |
| M-3 | Mn30Cu70 | 0.17 | 8.5 | 287 |
| M-4 | Mn60Cu40 | 0.16 | 8.1 | 309 |
| M-5 | Mn80Zn20 | 0.20 | 4.3 | 236 |

From the results set out in Table 4, it is found that by interposing between the first nonmagnetic metal layer and the semiconductor layer the work function control layer composed of a MnCu alloy having a Mn content of 20 to 60 at %, the area resistivity AR of the device can be 18% to 27% reduced while the MR ratio is kept at 8.0 or greater.

It is thus possible to make the semiconductor layer thicker than that in the prior art structure while the area resistivity of the device is kept at much the same level.

It is also found that with the work function control layer having a thickness in the range of 0.3 nm to 1.20 nm, the advantages of the invention are achievable as described above.

TABLE 5

(TiCu)

| Sample No. | Work function control layer TiCu | Area resistivity AR of the device ($\Omega \cdot \mu m^2$) | MR ratio (%) | Electroconductivity of the spacer layer (S/cm) |
|---|---|---|---|---|
| T-1 | — | 0.22 | 8.7 | 211 |
| T-2 | Ti30Cu70 | 0.19 | 8.4 | 250 |
| T-3 | Ti60Cu40 | 0.18 | 8.1 | 241 |
| T-4 | Ti80Zn20 | 0.17 | 3.1 | 287 |

From the results set out in Table 5, it is found that by interposing between the first nonmagnetic metal layer and the semiconductor layer the work function control layer composed of a TiCu alloy having a Ti content of 30 to 60 at %, the area resistivity AR of the device can be 14% to 23% reduced while the MR ratio is kept at 8.0 or greater.

It is thus possible to make the semiconductor layer thicker than that in the prior art structure while the area resistivity of the device is kept at much the same level.

It is also found that with the work function control layer having a thickness in the range of 0.3 nm to 1.20 nm, the advantages of the invention are achievable as described above.

Experimental Example II

Inventive CPP-GMR device samples having such a multilayer structure as shown in Table 6 were formed by sputtering, ready for experimentation. More specifically, such various samples as set out in Tables 7 to 10 were prepared with varied alloy materials (ZnCu, CrCu, MnCu, TiCu) for the work function control layers forming a part of the spacer layer at varied composition ratios (at %) of the alloys for the work function control layers.

It is here noted that the work function control layer-free samples (2Z-1, 2R-1, 2M-1, 2T-1) were all the same, with none of the work function control layers and the thickness of the first and second nonmagnetic metal layers Cu set at 0.6 nm.

Each of such various CPP-GMR device samples as set out in Tables 7 to 10 was measured and estimated according to the aforesaid procedures about (1) the MR ratio, (2) the area resistivity AR ($\Omega \cdot \mu m^2$) of the device, and (3) the electroconductivity (S/cm) of the spacer layer.

TABLE 6

| Multilayer structure | | Layer material | Thickness (nm) |
|---|---|---|---|
| Protective layer | | Ru | 2.0 |
| Free layer | | Co70Fe30 | 4.0 |
| Spacer laeyr | Second nonmagnetic metal layer | Cu | 0.7 |
| | Work function control layer | ZnCu, CrCu, MnCu or TiCu | 0.6 |
| | Semiconductor layer | ZnO | 1.4 |
| | Work function control layer | ZnCu, CrCu, MnCu or TiCu | 0.6 |
| | First nonmagnetic metal layer | Cu | 0.7 |
| Fixed magnetization layer | Inner layer | Co70Fe30 | 3.5 |
| | Nonmagnetic intermediate layer | Ru | 0.7 |
| | Outer layer | Co70Fe30 | 3.0 |
| Antiferromagnetic layer | | IrMn | 5.0 |
| Underlay layer | | NiCr | 4.0 |

TABLE 7

(ZnCu)

| Sample No. | Work function control layer ZnCu | Area resistivity AR of the device ($\Omega \cdot \mu m^2$) | MR ratio (%) | Electroconductivity of the spacer layer (S/cm) |
|---|---|---|---|---|
| 2Z-1 | — | 0.22 | 8.7 | 211 |
| 2Z-2 | Zn30Cu70 | 0.17 | 8.8 | 287 |
| 2Z-3 | Zn60Cu40 | 0.16 | 8.6 | 309 |
| 2Z-4 | Zn80Zn20 | 0.20 | 5.2 | 236 |

From the results set out in Table 7, it is found that by interposing the work function control layer composed of a ZnCu alloy having a Zn content of 30 to 60 at % between the first nonmagnetic metal layer and the semiconductor layer, and between the second nonmagnetic metal layer and the semiconductor layer, respectively, the area resistivity AR of the device can be 23% to 27% reduced while the MR ratio is kept at 8.0 or greater.

It is thus possible to make the semiconductor layer thicker than that in the prior art structure while the area resistivity of the device is kept at much the same level.

It is also found that with the work function control layer having a thickness in the range of 0.3 nm to 1.20 nm, the advantages of the invention are achievable as described above.

TABLE 8

(CrCu)

| Sample No. | Work function control layer CrCu | Area resistivity AR of the device (Ω·μm²) | MR ratio (%) | Electroconductivity of the spacer layer (S/cm) |
|---|---|---|---|---|
| 2R-1 | — | 0.22 | 8.7 | 211 |
| 2R-2 | Cr20Cu80 | 0.18 | 8.6 | 241 |
| 2R-3 | Cr30Cu70 | 0.17 | 8.5 | 287 |
| 2R-4 | Cr60Cu40 | 0.16 | 8.1 | 309 |
| 2R-5 | Cr80Zn20 | 0.20 | 4.3 | 236 |

From the results set out in Table 8, it is found that by interposing the work function control layer composed of a CrCu alloy having a Cr content of 20 to 60 at % between the first nonmagnetic metal layer and the semiconductor layer, and between the second nonmagnetic metal layer and the semiconductor layer, respectively, the area resistivity AR of the device can be 18% to 27% reduced while the MR ratio is kept at 8.0 or greater.

It is thus possible to make the semiconductor layer thicker than that in the prior art structure while the area resistivity of the device is kept at much the same level.

It is also found that with the work function control layer having a thickness in the range of 0.3 nm to 1.20 nm, the advantages of the invention are achievable as described above.

TABLE 9

(MnCu)

| Sample No. | Work function control layer MnCu | Area resistivity AR of the device (Ω·μm²) | MR ratio (%) | Electroconductivity of the spacer layer (S/cm) |
|---|---|---|---|---|
| 2M-1 | — | 0.22 | 8.7 | 211 |
| 2M-2 | Mn20Cu80 | 0.18 | 8.6 | 241 |
| 2M-3 | Mn30Cu70 | 0.17 | 8.5 | 287 |
| 2M-4 | Mn60Cu40 | 0.16 | 8.1 | 309 |
| 2M-5 | Mn80Zn20 | 0.20 | 4.3 | 236 |

From the results set out in Table 9, it is found that by interposing the work function control layer composed of a MnCu alloy having a Mn content of 20 to 60 at % between the first nonmagnetic metal layer and the semiconductor layer, and between the second nonmagnetic metal layer and the semiconductor layer, respectively, the area resistivity AR of the device can be 18% to 27% reduced while the MR ratio is kept at 8.0 or greater.

It is thus possible to make the semiconductor layer thicker than that in the prior art structure while the area resistivity of the device is kept at much the same level.

It is also found that with the work function control layer having a thickness in the range of 0.3 nm to 1.20 nm, the advantages of the invention are achievable as described above.

TABLE 10

(TiCu)

| Sample No. | Work function control layer TiCu | Area resistivity AR of the device (Ω·μm²) | MR ratio (%) | Electroconductivity of the spacer layer (S/cm) |
|---|---|---|---|---|
| 2T-1 | — | 0.22 | 8.7 | 211 |
| 2T-2 | Ti30Cu70 | 0.19 | 8.4 | 250 |
| 2T-3 | Ti60Cu40 | 0.18 | 8.1 | 241 |
| 2T-4 | Ti80Zn20 | 0.17 | 3.1 | 287 |

From the results set out in Table 10, it is found that by interposing the work function control layer composed of a TiCu alloy having a Ti content of 30 to 60 at % between the first nonmagnetic metal layer and the semiconductor layer, and between the second nonmagnetic metal layer and the semiconductor layer, respectively, the area resistivity AR of the device can be 14% to 23% reduced while the MR ratio is kept at 8.0 or greater.

It is thus possible to make the semiconductor layer thicker than that in the prior art structure while the area resistivity of the device is kept at much the same level.

It is also found that with the work function control layer having a thickness in the range of 0.3 nm to 1.20 nm, the advantages of the invention are achievable as described above.

Experimental Example III

Experimentation was carried out to form the work function control layer by means of thermal diffusion.

First of all, such a CPP-GMR device sample prior to heat treatment as set out in Table 11 was formed by sputtering, ready for experimentation. When the spacer layer set out in Table 11 was formed, the first non-magnetic metal layer composed of Cu, the semiconductor layer composed of ZnO deficient in oxygen (in other words, the Zn-enriched ZnO semiconductor layer) and the second nonmagnetic metal layer composed of Cu were sequentially formed by sputtering into a triple-layer structure. The semiconductor layer composed of ZnO deficient in oxygen was formed by sputtering using an oxygen-deficient ZnO target as it stood. The amount of oxygen in the ZnO semi-conductor layer was at least 13 at % smaller than that in Zn.

TABLE 11

| Multilayer structure | | Layer material | Thickness (nm) |
|---|---|---|---|
| Protective layer | | Ru | 2.0 |
| Free layer | | Co70Fe30 | 4.0 |
| Spacer layer | Second nonmagnetic metal layer | Cu | 0.9 |
| | Semiconductor layer | ZnO | 1.8 |
| | First nonmagnetic metal layer | Cu | 0.9 |
| Fixed magnetization layer | Inner layer | Co70Fe30 | 3.5 |
| | Nonmagnetic intermediate layer | Ru | 0.7 |
| | Outer layer | Co70Fe30 | 3.0 |
| Antiferromagnetic layer | | IrMn | 5.0 |
| Underlay layer | | NiCr | 4.0 |

After the CPP-GMR device sample shown in Table 11 and prior to heat treatment was formed, heat treatment was carried out at 290° C. for 3 hours. By that heat treatment, excessive Zn in the semiconductor layer forming a part of the spacer layer was diffused toward the first and the second nonmagnetic metal layer side, respectively. TEM observation revealed that the work function control layer composed of the ZnCu alloy was formed between the first nonmagnetic metal layer and the semiconductor layer, and between the second nonmagnetic metal layer and that semiconductor layer, respectively. The composition of the ZnCu alloy was roughly $Zn_{50}Cu_{50}$ (at %).

The setup of the CPP-GMR device after heat treatment is set out in Table 12.

TABLE 12

| Multilayer structure | | Layer material | Thickness (nm) |
|---|---|---|---|
| Protective layer | | Ru | 2.0 |
| Free layer | | Co70Fe30 | 4.0 |
| Spacer layer | Second nonmagnetic metal layer | Cu | 0.7 |
| | Work function control layer | ZnCu | 0.4 |
| | Semiconductor layer | ZnO | 1.4 |
| | Work function control layer | ZnCu | 0.4 |
| | First nonmagnetic metal layer | Cu | 0.7 |
| Fixed magnetization layer | Inner layer | Co70Fe30 | 3.5 |
| | Nonmagnetic intermediate layer | Ru | 0.7 |
| | Outer layer | Co70Fe30 | 3.0 |
| Antiferromagnetic layer | | IrMn | 5.0 |
| Underlay layer | | NiCr | 4.0 |

The CPP-GMR device sample prior to heat treatment such as the one set out in Table 11, and the CPP-GMR device sample after heat treatment such as the one set out in Table 12 was measured and estimated about (1) the MR ratio, (2) the area resistivity AR ($\Omega \cdot \mu m^2$), and (3) the electroconductivity (S/cm) of the spacer layer.

The results are set out in Table 13.

TABLE 13

| Sample No. | Setup of the device | Work function control layer | Area resistivity AR of the device ($\Omega \cdot \mu m^2$) | MR ratio (%) | Electroconductivity of the spacer layer (S/cm) |
|---|---|---|---|---|---|
| NHT-1 (no heat treatment) | Table 11 | Not used | 0.36 | 7.9 | 109 |
| HT-1 (heat treatment) | Table 12 | Used | 0.19 | 8.5 | 226 |

From the results described above, the advantages of the invention would be undisputed. That is, the spacer layer in the inventive CPP-GMR device comprises a first nonmagnetic metal layer and a second nonmagnetic metal layer, each formed of a nonmagnetic metal material, and a semiconductor layer interposed between the first non-magnetic metal layer and the second nonmagnetic metal layer, and further comprises a work function control layer formed between said first nonmagnetic metal layer and said semiconductor layer and/or between said second nonmagnetic metal layer and said semiconductor layer, wherein said semiconductor layer is an n-type semiconductor, and said work function control layer is made of a material having a work function smaller than that of said first nonmagnetic metal layer, and said second nonmagnetic metal layer. It is thus possible to obtain by far more improved advantages: the semiconductor layer forming a part of the spacer layer can be so thicker than ever while keeping the area resistivity of the device low as desired (in other words, it is possible to keep the area resistivity of the device low as desired while making the semiconductor layer forming a part of the spacer layer thicker), ever higher MR performance is achievable, and the variation of the area resistivity of the device can be substantially held back with much more improvements in film performance.

Referring here to possible applications to the industry, the present invention could find use in the industry of a magnetic disk system comprising a magneto-resistive effect device adapted to read the magnetic field strength of a magnetic recording medium or the like in the form of signals.

What we claim is:

1. A giant magneto-resistive effect device (CPP-GMR device) having a CPP (current perpendicular to plane) structure comprising a spacer layer, and a fixed magnetization layer and a free layer stacked one upon another with said spacer layer interposed between them, with a sense current applied in a stacking direction, characterized in that:

said free layer functions such that a magnetization direction changes depending on an external magnetic field, and said spacer layer comprises a first nonmagnetic metal layer and a second nonmagnetic metal layer, each formed of a nonmagnetic metal material, and a semiconductor layer interposed between the first nonmagnetic metal layer and the second nonmagnetic metal layer, and further comprises a work function control layer formed between said first nonmagnetic metal layer and said semiconductor layer and/or between said second nonmagnetic metal layer and said semiconductor layer, wherein:

said semiconductor layer is an n-type semiconductor, and said work function control layer is made of a material having a work function smaller than that of said first nonmagnetic metal layer, and said second nonmagnetic metal layer.

2. The magneto-resistive effect device according to claim 1, wherein:

said first nonmagnetic metal layer and said second nonmagnetic metal layer are each Cu, said work function control layer is one selected from the group consisting of ZnCu, CrCu, MnCu, and TiCu, and said semiconductor layer is one selected from the group consisting of ZnO, ZnS, ZnSe, GaN, GaP, GaSb, and InSn.

3. The magneto-resistive effect device according to claim 2, wherein:

said semiconductor layer is ZnO, and said work function control layer is ZnCu having a Zn content of 30 to 60 at %.

4. A fabrication process for a magneto-resistive effect device as recited in claim 3, characterized in that:

when said spacer layer is formed, a first nonmagnetic metal layer composed of Cu, a semiconductor layer composed of ZnO deficient in oxygen and a second nonmagnetic metal layer composed of Cu are sequentially formed by sputtering into a triple-layer structure, and thereafter, excessive Zn in the semiconductor layer is diffused by heat treatment toward the first nonmagnetic metal layer side and the second nonmagnetic metal layer side, respectively, and a work function control layer composed of a ZnCu alloy is formed between the first nonmagnetic metal layer and the semiconductor layer, and between the second nonmagnetic metal layer and said semiconductor layer, respectively.

5. The magneto-resistive effect device according to claim 2, wherein:
said semiconductor layer is ZnO, and
said work function control layer is MnCu having a Mn content of 20 to 60 at %.

6. The magneto-resistive effect device according to claim 2, wherein:
said semiconductor layer is ZnO, and
said work function control layer is TiCu having a Ti content of 30 to 60 at %.

7. The magneto-resistive effect device according to claim 2, wherein:
said semiconductor layer is ZnO, and
said work function control layer is CrCu having a Cr content of 20 to 60 at %.

8. The magneto-resistive effect device according to claim 1, which has an area resistivity of 0.1 to 0.3 $\Omega \cdot \mu^2$.

9. The magneto-resistive effect device according to claim 1, wherein said work function control layer has a thickness of 0.3 nm to 1.20 nm.

10. A thin-film magnetic head, characterized by comprising:
a plane opposite to a recoding medium,
a magneto-resistive effect device as recited in claim 1, which is located near said medium opposite plane for detecting a signal magnetic field from said recording medium, and
a pair of electrodes for passing a current in the stacking direction of said magneto-resistive effect device.

11. A head gimbal assembly, characterized by comprising:
a slider including a thin-film magnetic head as recited in claim 10 and located in opposition to a recording medium, and
a suspension adapted to resiliently support said slider.

12. A hard disk system, characterized by comprising:
a slider including a thin-film magnetic head as recited in claim 10 and located in opposition to a recording medium, and
a positioning means adapted to support and position said slider with respect to said recording medium.

* * * * *